United States Patent
Sundararajan

(10) Patent No.: US 7,529,988 B1
(45) Date of Patent: May 5, 2009

(54) STORAGE OF DESCRIPTIVE INFORMATION IN USER DEFINED FIELDS OF FAILURE BITMAPS IN INTEGRATED CIRCUIT TECHNOLOGY DEVELOPMENT

(75) Inventor: Srikanth Sundararajan, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 918 days.

(21) Appl. No.: 10/654,247

(22) Filed: Sep. 2, 2003

(51) Int. Cl.
*G11C 29/00* (2006.01)
*G11C 7/00* (2006.01)

(52) U.S. Cl. ...................... 714/723; 365/201

(58) Field of Classification Search ................ 714/724, 714/718–723; 707/101; 365/201
See application file for complete search history.

(56) References Cited

U.S. PATENT DOCUMENTS

| | | | |
|---|---|---|---|
| 5,963,966 A | | 10/1999 | Mitchell et al. |
| 6,185,707 B1 * | | 2/2001 | Smith et al. ................. 714/724 |
| 6,269,455 B1 * | | 7/2001 | Deas ........................... 714/29 |
| 6,408,315 B1 * | | 6/2002 | McManus et al. ........ 715/500.1 |
| 6,510,398 B1 * | | 1/2003 | Kundu et al. ................. 702/117 |
| 6,519,725 B1 | | 2/2003 | Huisman et al. |
| 6,532,121 B1 * | | 3/2003 | Rust et al. ........................ 360/8 |
| 6,532,182 B2 * | | 3/2003 | Ogawa et al. ................ 365/201 |
| 6,535,642 B1 | | 3/2003 | De Bonet |
| 6,539,418 B2 | | 3/2003 | Schneider et al. |
| 6,553,329 B2 * | | 4/2003 | Balachandran .............. 702/118 |
| 6,564,346 B1 * | | 5/2003 | Vollrath et al. .............. 714/723 |
| 6,831,575 B2 * | | 12/2004 | Wu et al. ....................... 341/50 |
| 2003/0046621 A1 * | | 3/2003 | Finkler et al. ................ 714/723 |

OTHER PUBLICATIONS

"Byte-Aligned Bitmap Compression" by Antoshenkov, G. Data Compression Conference, 1995. DCC '95. Proceedings Publication Date: Mar. 28-30, 1995 On p. 476 Inspec Accession No. 5099268.*

"Test response compression and bitmap encoding for embedded memoriesin manufacturing process monitoring" by Chen et al. Test Conference, 2001. Proceedings. International Publication Date: 2001On pp. 258-267 ISBN: 0-7803-7169-0 Inspec Accession No. 7211343.*

* cited by examiner

*Primary Examiner*—Cynthia Britt
(74) *Attorney, Agent, or Firm*—Farjami & Farjami LLP

(57) ABSTRACT

A system for processing tester information including receiving data from a tester and forming a user defined field for storing descriptive information. A bitmap is created and compressed into a compressed image. The user defined field and the compressed image are then combined into a data structure.

20 Claims, 3 Drawing Sheets

STORAGE OF DESCRIPTIVE INFORMATION IN USER DEFINED FIELDS OF FAILURE BITMAPS IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

Electronic products are used in almost every aspect of life, and the heart of these electronic products is the integrated circuit. Integrated circuits are used in everything from computers to cell phones.

Integrated circuits are made in and on silicon wafers by extremely complex systems that require the coordination of hundreds or even thousands of precisely controlled processes to produce a finished semiconductor wafer. Each finished semiconductor wafer has hundreds of tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but on only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this has not been the way to answer to some major of the problems.

The problems include, but are not limited to, maintaining information regarding large numbers of failure bitmaps.

Solutions to these problems have been long sought but prior developments have not taught or suggested any solutions and, thus, solutions to these problems have long eluded those skilled in the art.

DISCLOSURE OF THE INVENTION

The present invention provides a system for processing tester information including receiving data from a tester and forming a user defined field for storing descriptive information. A failure bitmap is created and compressed into a compressed image. The user defined field and the compressed image are then combined into a data structure.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
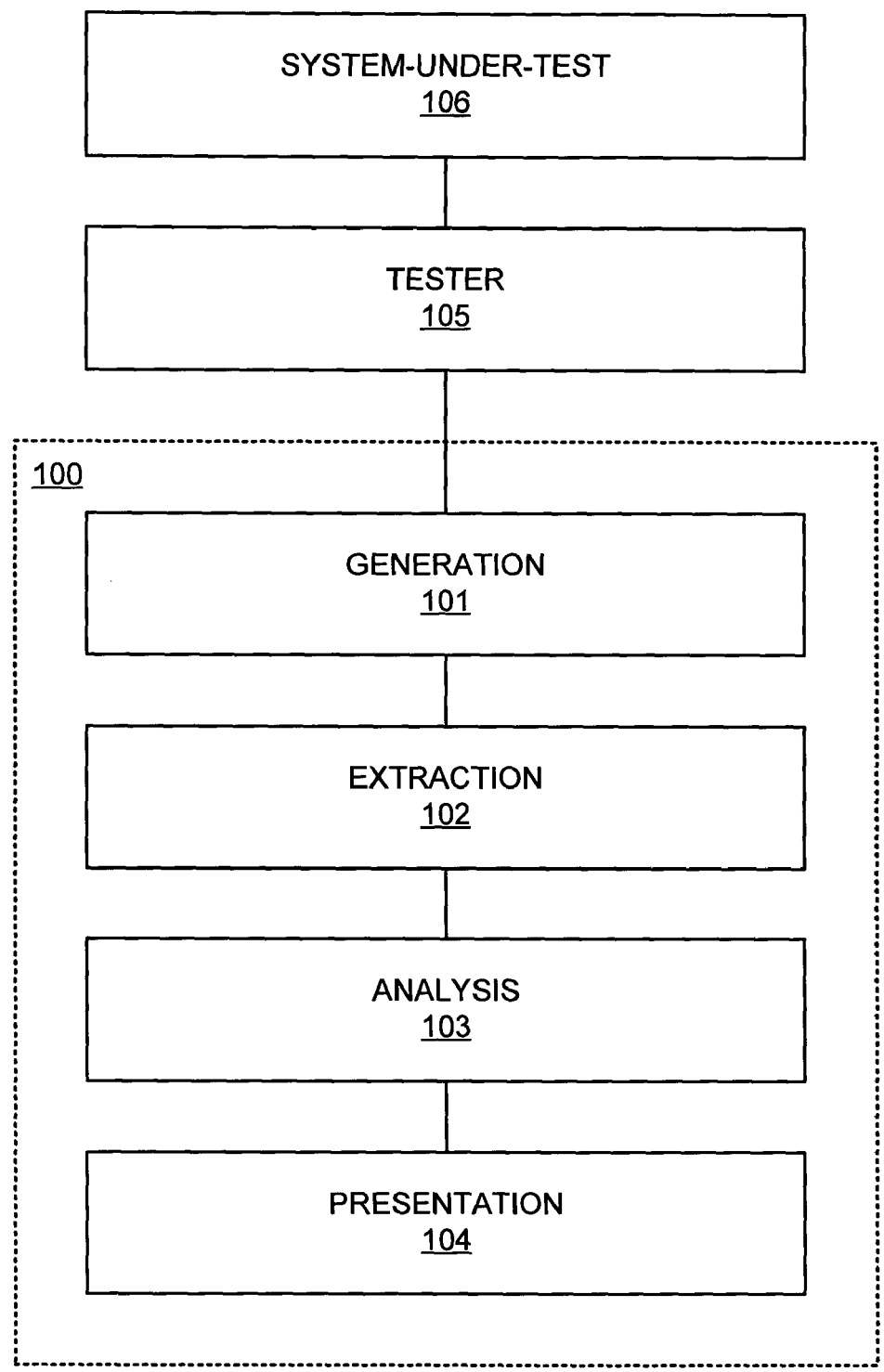
FIG. 1 is a block diagram of a tester information processing system according to the present invention.

Referring now to FIG. 1 (PRIOR ART), therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are generation block 101, extraction block 102, analysis block 103, and presentation block 104. Each of the blocks can stand independently in the tester information processing system 100, and within these blocks are various commercially available techniques, methodologies, process, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the systemunder-test 106 can be anything from a complete wafer down to an element of an individual semiconductor device on a die.

In generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
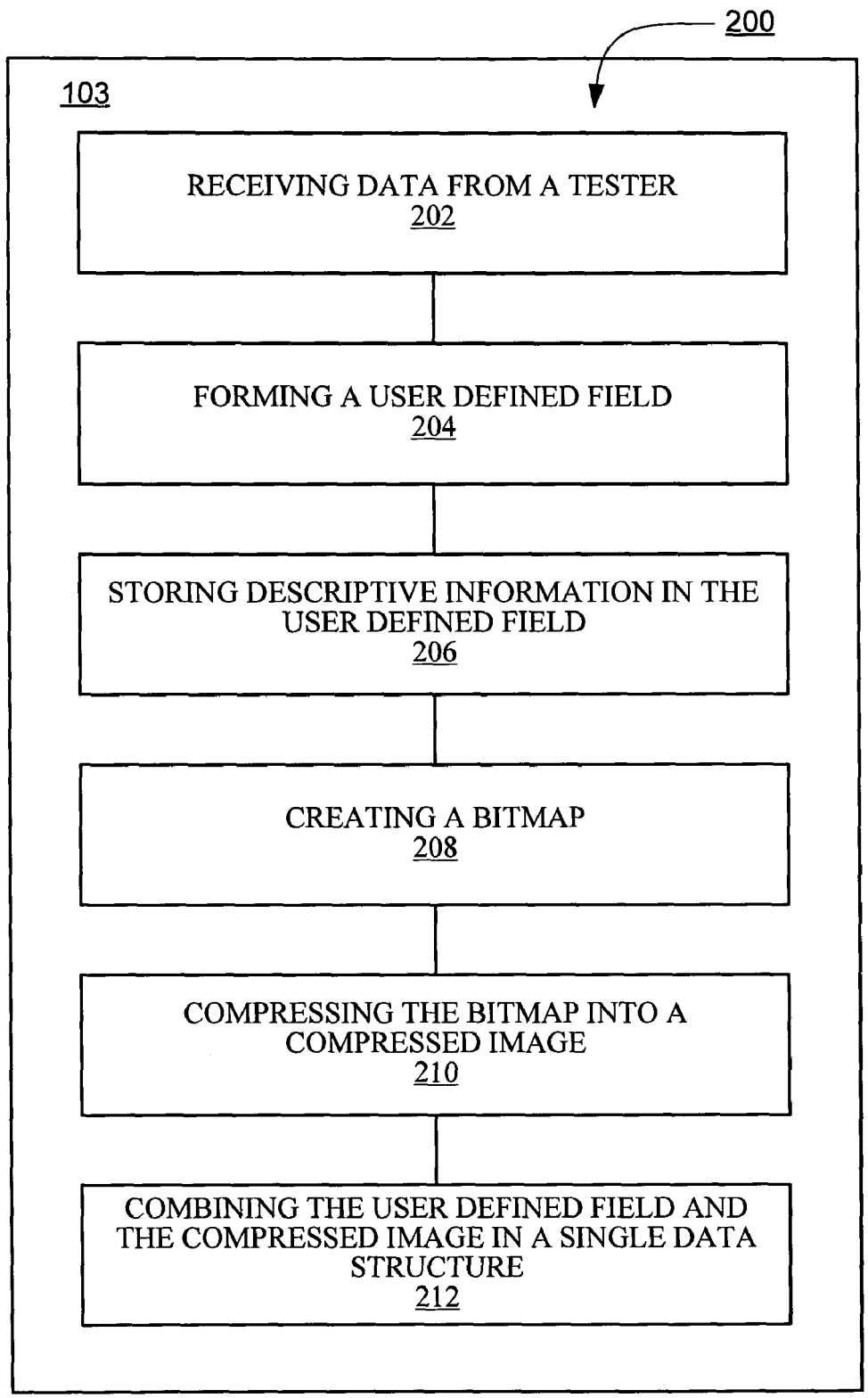
FIG. 2 is one of the blocks of the present invention according to the present invention.

Referring now to FIG. 2, therein is shown the analysis block 103 having a flow chart 200 for improving memory device failure bitmap processing by storing the bitmap's tag information in user defined fields in the failure bitmap.

Briefly, the diagnostic flow proceeds with test patterns being generated. These patterns are applied by the tester 105 of FIG. 1, a memory device tester, to the system-under-test 106, or memory chip, being tested. The tester 105 continues applying the patterns, collecting fail data, if any, in the process. The resulting tester output is then analyzed to generate an actual or virtual failure bitmap.

Since there may be literally millions of failure bitmaps generated during production testing, it is desirable that the failure bitmaps can be compressed for storage and decompressed for use. Optimally, lossless compression schemes take advantage of repeating strings of non-failed bits. These schemes take advantage of this redundancy by decreasing the cost of storing such common sequences. Examples of such schemes are the Lempel-Ziv family, including LZ77, LZ78, LZW and derivatives. LZW (Lempel-Ziv-Welch) is generally considered to be at or near the state-of-the-art in lossless compression and is a so-called universal compression scheme, which means that in the limit it will converge towards the maximum amount of compression possible. Decompression and reconstruction of the bitmaps also can be easily performed with these schemes.

It has been discovered that it is desirable to maintain descriptive information regarding the failure bitmaps but that the storage of the descriptive information is costly in terms of storage space as the number of failure bitmaps generated continues to increase. To alleviate this problem, it has been discovered that the descriptive information and meta-information including tags of the bitmaps can be stored in a single data structure used to store a compressed image of the compressed failure bitmap.

A system for accomplishing the above is represented by a flow chart 200 which includes: a step 202 of receiving data from a tester; a step 204 of forming a user defined field; a step 206 of storing descriptive information in the user defined field; a step 208 of creating a bitmap; a step 210 of compressing the failure bitmap into compressed image information; and a step 212 of combining the user defined field and the compressed image information into a single data structure.

Figure 3:
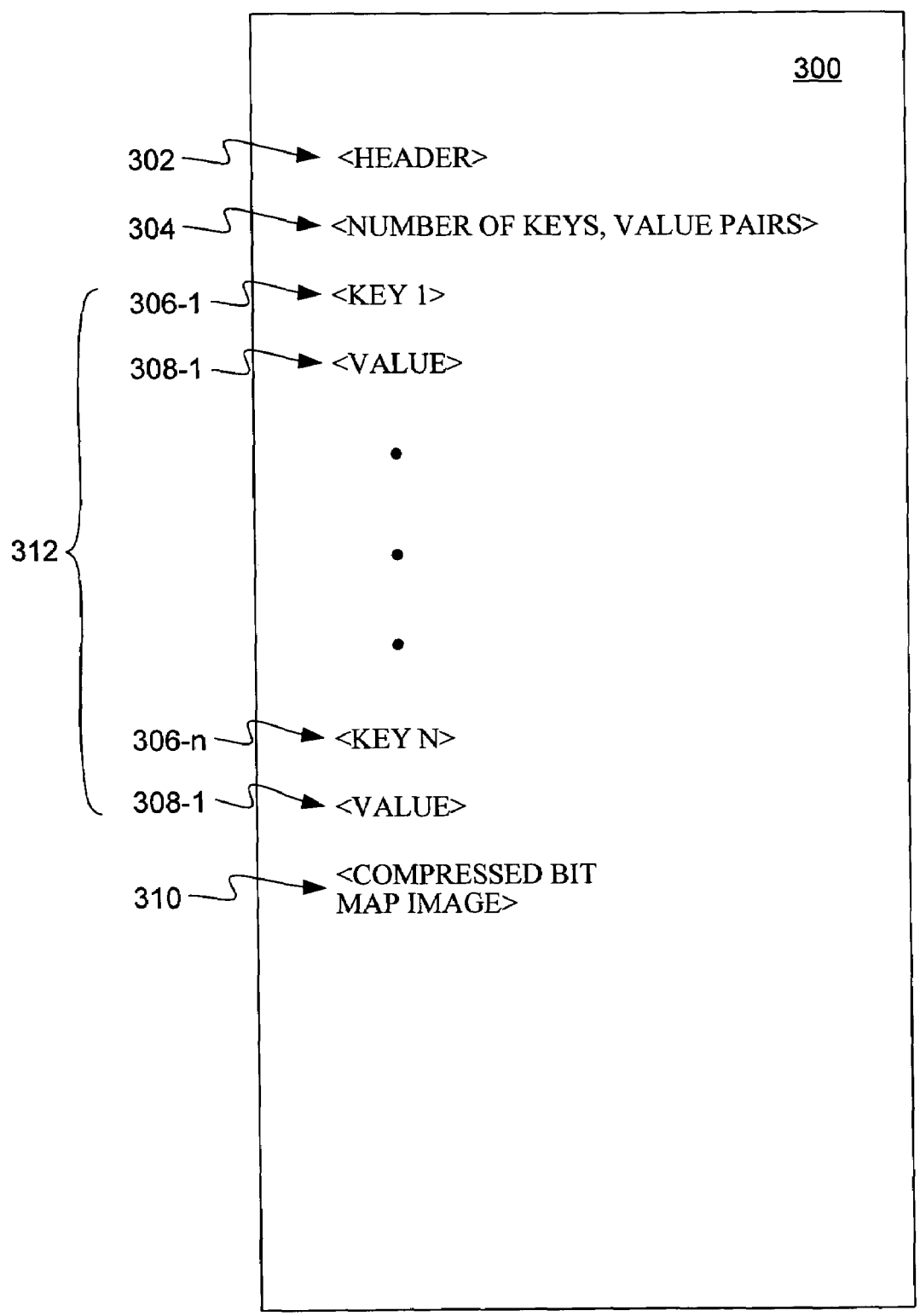
FIG. 3 is a data structure according to the present invention.

Referring now to FIG. 3, therein is shown an exemplary data structure 300 in accordance with the present invention. The data structure 300 has a <HEADER> 302, a <NUMBER OF KEYS, VALUE PAIRS> 304, a <KEY 1> 306-1 through a <KEY N> 306-n, associated values <VALUE> 308-1 through 308-n, and a <COMPRESSED IMAGE> 310.

The <HEADER> 302 will generally contain identifying information such as lot number, date, tag number, etc. The <KEY-N> 306-n is generally the indicia number for the data inserted in <VALUE> 308-n, which are user defined fields 312.

The addition of tagged meta-information (information about the information) to failure bitmaps allows for more efficient storage and indexing of large (production volume) collections of such bitmaps. It also allows for cross-referencing and data-mining on the collections of bitmaps for yield and reliability enhancement.

The above data structure 300 causes a physical transformation within a computer (not shown) because the computer acts on signals and transforms them during its operation then changes the state of its components during the execution of a process. The computer achieves a practical application of providing a failure bitmap with descriptive information, which can be used in failure analysis of flash memory devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. A method for use by a system for processing tester information, said method comprising:
    receiving data from a tester;
    forming a user defined field;
    storing descriptive information in the user defined field;
    creating a bitmap;
    compressing the bitmap into a compressed image; and
    combining the user defined field as uncompressed data, and the compressed image in a single data structure;

said method providing said single data structure for use by said system to store tester information.

2. The method as claimed in claim 1 wherein:
forming the user-defined field includes:
 forming numbering key and value pairs.

3. The method as claimed in claim 1 wherein:
comprising the bitmap uses a Lempel-Ziv compression scheme.

4. The method as claimed in claim 1 wherein:
forming the user-defined field includes storing tag information of the bitmap.

5. The method as claimed in claim 1 wherein:
creating the bitmap includes creating a real or virtual bitmap.

6. A method for use by a system for processing tester information, said method comprising:
 receiving data from a memory device tester;
 forming a user defined field;
 storing descriptive information and meta-information of a memory device in the user defined field;
 creating a failure bitmap of the memory device;
 compressing the failure bitmap into a compressed image; and
 combining the user defined field as uncompressed data, and the compressed image in a single data structure;
 said method providing said single data structure for use by said system in performing failure analysis of said memory device.

7. The method as claimed in claim 6 additionally comprising:
 forming a header including memory device identification information; and
 wherein forming the user-defined field includes:
  forming numbering key and value pairs for providing an indicia number and data.

8. The method as claimed in claim 6 wherein:
compressing the failure bitmap uses a Lempel-Ziv-Welch compression scheme.

9. The method as claimed in claim 6 wherein:
forming the user-defined field includes storing tag information and tagged meta-information to the failure bitmap of the memory device.

10. The method as claimed in claim 6 wherein:
creating the failure bitmap includes creating a real or virtual failure bitmap of the memory device.

11. A system for processing tester information, the system including a data storage having stored thereon a data structure comprising:
 a user defined field having descriptive information of a bit map;
 a compressed image of the bitmap; and
 a single data structure combining the user defined field as uncompressed data, and the compressed image of the bitmap;
 said single data structure provided for use by said system to store tester information.

12. The system as claimed in claim 11 wherein:
the user-defined field includes:
 numbering key and value pairs.

13. The system as claimed in claim 11 wherein:
the compressed image is Lempel-Ziv compressed.

14. The system as claimed in claim 11 wherein:
the user-defined field includes tag information of the bitmap.

15. The system as claimed in claim 11 wherein:
the compressed image is a real or virtual bitmap.

16. A system for processing tester information, the system including a data storage having stored thereon a data structure comprising:
 a user defined field having descriptive information and meta-information of a failure bitmap;
 a compressed image of the failure bitmap of a memory device; and
 a single data structure combining the user defined field as uncompressed data, and the compressed image of the failure bitmap;
 said single data structure provided for use by said system in performing failure analysis of said memory device.

17. The system as claimed in claim 16, wherein said data structure additionally comprises a header including memory device identification information; and
 wherein the user-defined field includes:
  numbering key and value pairs for providing an indicia number and data.

18. The system as claimed in claim 16 wherein:
the compressed image is Lempel-Ziv-Welch compressed.

19. The system as claimed in claim 16 wherein:
the user-defined field includes tag information and tagged meta-information to the failure bitmap of the memory device.

20. The system as claimed in claim 16 wherein:
the compressed image includes a real or virtual failure bitmap of the memory device.

* * * * *